(12) United States Patent
Tao et al.

(10) Patent No.: US 11,892,667 B2
(45) Date of Patent: Feb. 6, 2024

(54) DISPLAY PANEL, DISPLAY DEVICE, AND METHOD OF MANUFACTURING DISPLAY PANEL

(71) Applicants: BOE MLED Technology Co., Ltd., Beijing (CN); BOE Technology Group Co., Ltd., Beijing (CN)

(72) Inventors: Jingfu Tao, Beijing (CN); Jian Sang, Beijing (CN); Lu Yu, Beijing (CN); Haiwei Sun, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 331 days.

(21) Appl. No.: 17/491,100

(22) Filed: Sep. 30, 2021

(65) Prior Publication Data
US 2022/0244441 A1 Aug. 4, 2022

(30) Foreign Application Priority Data
Jan. 29, 2021 (CN) .......................... 202110129720.8

(51) Int. Cl.
*G02B 5/26* (2006.01)
*H01L 25/075* (2006.01)
*G02B 5/20* (2006.01)

(52) U.S. Cl.
CPC .............. *G02B 5/26* (2013.01); *G02B 5/206* (2013.01); *H01L 25/0753* (2013.01)

(58) Field of Classification Search
CPC ....... G02B 5/26; G02B 5/206; H01L 25/0753; H01L 25/167; H01L 33/60; G09F 9/33
See application file for complete search history.

(56) References Cited

U.S. PATENT DOCUMENTS

| | | | |
|---|---|---|---|
| 2011/0193127 A1* | 8/2011 | Won ...................... | H01L 33/647 257/99 |
| 2017/0062674 A1* | 3/2017 | Kwon ................. | H01L 25/0753 |
| 2018/0350787 A1* | 12/2018 | Kiridoshi ................ | H01L 33/44 |
| 2019/0027658 A1* | 1/2019 | Gould ..................... | H01L 33/54 |

* cited by examiner

*Primary Examiner* — Elmito Breval
(74) *Attorney, Agent, or Firm* — IPro, PLLC

(57) ABSTRACT

The present disclosure discloses a display panel which includes a substrate with varied reflectivity dependent upon different wavelengths; a plurality of light emitting diodes located on the substrate; and a light adjusting layer located on the substrate, wherein the light adjusting layer and the plurality of light emitting diodes are located on the same side of the substrate, the transmittance of material forming the light adjusting layer is varied dependent upon different wavelengths, and the transmittance change of the light adjusting layer at different wavelengths is inversely correlated with the change of the reflectivity of the substrate at the corresponding wavelengths.

14 Claims, 4 Drawing Sheets

DISPLAY PANEL, DISPLAY DEVICE, AND METHOD OF MANUFACTURING DISPLAY PANEL

CROSS-REFERENCE TO RELATED APPLICATIONS

This application claims priority to Chinese Patent Application No. 202110129720.8 filed in China on Jan. 29, 2021, which is incorporated herein by reference in its entirety.

TECHNICAL FIELD

The present disclosure is in the field of display technology, and particularly relates to a display panel, a display device, and a method of manufacturing the display panel.

BACKGROUND

In recent years, with the continuous development of the display technology, the demand for direct display field is more and more exuberant, at present the main growth point of the requirement of the display technology is in the field of mini LED and micro LED display. In the current display panel, when external light illuminates a substrate, the color of the substrate is reflected, and the reflected color of the substrate easily affects the overall color of the display panel, that is, the current display panel has a poor shielding effect on the color of the substrate. That is, the conventional direct display products, which are seen by the naked eye, have a problem that they are not sufficiently dark and the shielding effect of color of the substrate is poor. In addition, this type of display device has a problem of large power consumption.

Thus, current display panels, display devices, and methods of manufacturing the display panels remain to be improved.

SUMMARY

The present disclosure provides a display panel which includes a substrate with varied reflectivity dependent upon different wavelengths; a plurality of light emitting diodes which are located on the substrate; and a light adjusting layer, wherein the light adjusting layer is located on the substrate, the light adjusting layer and the plurality of light emitting diodes are located on the same side of the substrate, the transmittance of material forming the light adjusting layer at different wavelengths is different, and the transmittance change of the light adjusting layer at different wavelengths is inversely correlated with the change of the reflectivity of the substrate at the corresponding wavelength. According to embodiments of the present disclosure, the transmittance of the material forming the light adjusting layer decreases at different wavelengths while a reflectivity of the substrate increases at the corresponding wavelengths; the transmittance of the material forming the light adjusting layer increases at different wavelengths while the reflectivity of the substrate decreases at the corresponding wavelengths.

According to the embodiments of the present disclosure, the materials forming the light adjusting layer include a black glue material and at least one particle material having a color. Thus, the light adjusting layer of the present disclosure can be made to have different transmittances at different wavelengths.

According to the embodiment of the present disclosure, the substrate is a copper-containing printed circuit board, and the reflectivity of the substrate under blue light and the reflectivity of the substrate under green light are both less than the reflectivity of the substrate under red light. Thus, the transmittance of the light adjusting layer under the blue light and the transmittance of the light adjusting layer under the green light are both greater than the transmittance of the light adjusting layer under the red light, so that the display panel has a higher blackness value, and the display panel does not display the color information of the substrate, so that the visual effect can be better improved.

According to the embodiment of the present disclosure, the display substrate further includes a protective layer and an optical glue layer, wherein the optical glue layer is located on one side of the light adjusting layer remote from the substrate, the protective layer is located on one side of the optical glue layer remote from the light adjusting layer. Thus, by using the protective layer and the optical glue layer, a better protection of the light adjusting layer is achieved.

Another embodiment of the present disclosure further provides a display device which includes the display panel in any one of the embodiments as previously described. Therefore, the display device has all the features and advantages of the display panel previously described and will not be described in detail herein.

The present disclosure also provides a method of manufacturing the above-described display panel which includes the following steps of: obtaining an overall reflectivity R of the display panel according to a preset Lab value of the display panel; determining a functional relationship between the overall reflectivity R of the display panel and the reflectivity R1-Rn of different levels of reflected light in the display panel at the interface between the display panel and air by fitting, wherein the reflectivity Rr of the reflected light passing through the interface between the light adjusting layer and the substrate at the interface between the display panel and air is related to the reflectivity of the substrate and the transmittance of the light adjusting layer, and the reflectivity of the substrate at different wavelengths are different; determining transmittance curves of the light adjusting layer at different wavelengths according to the functional relationship; obtaining the material for forming the light adjusting layer according to the transmittance curve of the light adjusting layer; and forming a plurality of light emitting diodes on the substrate, and forming the light adjusting layer by using the material. Thus, the display panel having high transmittance, low power consumption, and the like can be obtained by using the method, and furthermore, the method has the advantage of simple operation.

According to the embodiment of the present disclosure, the step that determining the functional relationship between the overall reflectivity R of the display panel and the reflectivity R1-Rn of different levels of reflected light in the display panel at the interface between the display panel and the air by fitting includes: providing the light adjusting layers having different transmittances and setting the transmittance of the light adjusting layer between 1% and 99%; arranging the light adjusting layers with different transmittances on the substrate to obtain a plurality of display panel models, wherein the overall transmittances R' of the display panel models having the light adjusting layers with different transmittances satisfy: $R'=R1+R2+R3+R4+R5+R6+\ldots+Rn$, wherein the range of values of n decreases as the transmittance of the light adjusting layer decreases; and measuring the overall reflectivity R' of a plurality of the display panel models, respectively, to obtain a functional relationship between the overall reflectivity R of the display panel and the reflectivity R1-Rn of different levels of reflected light in the display panel at the interface between the display panel and air. Thus, by using the method, the relationship between the overall reflectivity R of the display panel and the reflectivity Rr of the reflected light passing through the interface between the light adjusting layer and the substrate at the interface between the display panel and the air can further be determined, wherein Rr is related to the reflectivity of the substrate and the transmittance of the light adjusting layer, and the transmittance curves of the light adjusting layer at different wavelengths is further be determined.

According to the embodiment of the present disclosure, the preset Lab value of the display panel is $L\in(20\sim40)$, a=0, b=0. Thus, a display panel product which is visible to naked eyes is dark sufficiently, so that the color characteristics of the substrate are not visible to the naked eyes and can better meet the visual requirements.

According to the embodiment of the present disclosure, the substrate is the copper-containing printed circuit board, the display panel includes the light adjusting layer, the optical glue layer, and the protective layer, and the reflectivity Rr of the reflected light passing through the interface between the light adjusting layer and the substrate in R1-Rn at the interface between the display panel and air satisfies: Rr=Rbase*Tr*Tr, wherein r=4, Tr is the transmittance of the light adjusting layer, and Rbase is the reflectivity of the substrate.

DESCRIPTION OF NUMBERS IN THE ACCOMPANY DRAWINGS

100—substrate, 200—light emitting diode, 300—light adjusting layer, 400—optical glue layer, and 500—protective layer.

DETAILED DESCRIPTION

Embodiments of the present disclosure are described in detail below. The embodiments described below are exemplary and intended to explain the disclosure and should not be understood as limits to the disclosure. For specific techniques or conditions which are not specified in the embodiments, they are performed according to techniques or conditions described in the references in the art or according to product specifications. The reagents used are conventional products available on the market without specifying the manufacturer.

The inventors have found that current display panel has higher power consumption to reach a target brightness. Also, when a colored substrate is used in the display panel, color information of the substrate can be observed by observing the outer surface of the display panel with naked eyes, resulting in poor visual effect of the product and affecting user experiences.

Figure 1:
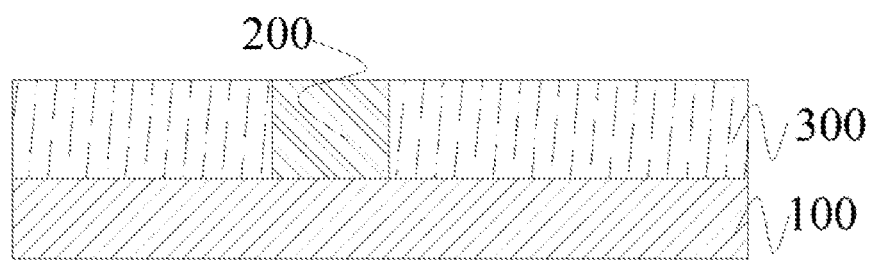
FIG. 1 is a schematic structural diagram illustrating a display panel of one embodiment of the present disclosure.

In order to improve the above-mentioned technical problems, in one aspect of the present disclosure, the present disclosure provides a display panel, and with reference to FIG. 1, the display panel includes a substrate 100, a plurality of light emitting diodes 200, and a light adjusting layer 300, wherein the reflectivity of the substrate 100 is different at different wavelengths, the plurality of light emitting diodes 200 are located on the substrate 100, the light adjusting layer 300 is located on the substrate 100, the light adjusting layer 300 and the plurality of light emitting diodes 200 are located on the same side of the substrate 100, the transmittance of materials forming the light adjusting layer 300 is different at different wavelengths, and the transmittance change of the light adjusting layer 300 at different wavelengths is inversely correlated with the reflectivity change of the substrate 100 at corresponding wavelength. Thus, by using the light adjusting layer corresponding to the spectral characteristics of the substrate, so that the transmittance of the light adjusting layer changes corresponding to the change in the reflectivity of the substrate with the change in the wavelength of incident light, the power consumption of the display panel can be reduced, achieving the purpose of greatly reducing the power consumption under displaying the same brightness picture, and the surface of the display panel has no color characteristics of the substrate, has a higher blackness value, has a better visual experiences, and improves the market competitiveness of products.

It should be noted that the number of light emitting diodes in FIG. 1 is one, FIG. 1 merely illustrates the positional relationship of various components, the number of light emitting diodes in FIG. 1 is not to be understood as limitation of the present disclosure, and the number of light emitting diodes can also be any integer greater than one, and a skilled person can make a selection according to use requirements.

According to embodiments of the present disclosure, the transmittance of the material forming the light adjusting layer decreases at different wavelengths while the reflectivity of the substrate increases at the corresponding wavelengths. Optionally, the transmittance of the material forming the light adjusting layer increases at different wavelengths while the reflectivity of the substrate decreases at the corresponding wavelengths. That is, the transmittance of the material forming the light adjusting layer at different wavelengths is inversely correlated with the variation trend of the reflectivity of the substrate at different wavelengths, therefore the color of the substrate is better covered and the blackness of the display panel visible to the naked eyed of the user is increased. Furthermore, since the transmittance of the light adjusting layer is different at different wavelengths, the power consumption can be better reduced: in general, the spectral transmittance of the light adjusting layer is random and close to linear; in this case, when the display panel displays a white picture, the transmittance of light emitting diode chips with different colors encapsulated in the light adjusting layer is basically consistent; then the luminous intensities of the light emitting diodes with different luminous colors are proportioned according to the colors to be displayed; and taking the RGB color matching as an example, the luminous intensities of the RGB light emission are finally required to be consistent. However, when the light adjusting layer provided in the present disclosure is used, since the spectral transmittance of a film changes, the transmittance of light of a certain color will be higher than that of other colors, for example, the transmittance of a blue and green chip in the film becomes higher, and then the luminous intensity of the light emitting diode is matched at this moment, namely, the luminous intensity of the blue and green chip can be reduced. Then at the same display power consumption, the power consumption of the display panel becomes much lower.

According to embodiments of the present disclosure, the material forming the light adjusting layer includes a black glue material and at least one particle material having a color. The specific type, particle size, content, etc. of the colored particles are not limited in the present disclosure, as long as they can satisfy the above-mentioned changing rule for the transmittance of the formed light adjusting layer at different wavelengths after being doped with the black glue. By using the light adjusting layer, the color of the substrate can be better shielded, achieving the perception effect that the display panel appears dark when human eyes view the display panel. Specifically, a person skilled in the art would have been able to determine the color to be exhibited by the light adjusting layer according to the determined transmittance curve of the light adjusting layer within a certain wavelength range, so as to change the color of the material of the conventional light adjusting layer by means including but not limited to adding particles having a color, and to obtain the light adjusting layer of which the transmittance changes with the change in wavelength.

Figure 2:
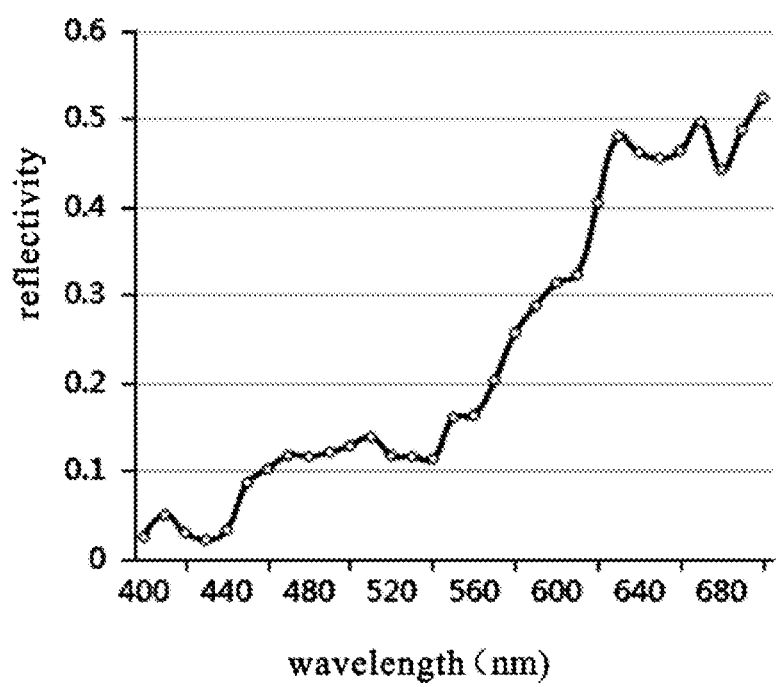
FIG. 2 is a relationship graph of reflectivity versus wavelength for a substrate of one embodiment of the present disclosure.

According to the embodiments of the present disclosure, the substrate can be a copper-containing printed circuit board. Taking the copper-containing printed circuit board as an example, the surface color of the substrate is yellow, and the shielding effect of the existing film on the color of the substrate is poor, and the color of the substrate cannot be completely shielded. Referring to FIG. 2, the reflectivity of the substrate under blue light and the reflectivity of the substrate under green light are both less than the reflectivity of the substrate under red light. As can be seen from the previous discussion, the transmittance of the light adjusting layer of the present disclosure at different wavelengths is inversely correlated with the trend of reflectivity of the substrate at different wavelengths. That is, the transmittance of the light adjusting layer of the present disclosure in blue light and the transmittance of the light adjusting layer in green light are both greater than the transmittance of the light adjusting layer under red light. The light adjusting layer of the present disclosure has a higher blackness value, can better shield the color of the substrate, and has a better visual experience. Thus, the transmittance of the display panel of the present disclosure is higher than that of the existing display panel, and the same picture brightness as that of the existing display panel can be achieved using less power consumption, that is to say, the display panel of the present disclosure has the advantage of reducing the power consumption, and the display panel of the present disclosure is sufficiently black to be seen by the naked eyes, so that the visual effect observed by the human eyes can be improved.

Figure 3:
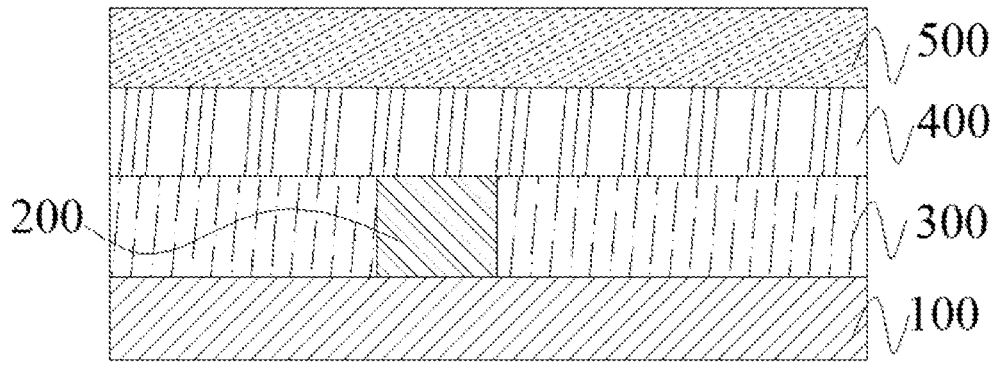
FIG. 3 is a schematic structural diagram illustrating a display panel of another embodiment of the present disclosure.

According to the embodiment of the present disclosure, with reference to FIG. 3, the display panel further includes an optical glue layer 400 and a protective layer 500, wherein the optical glue layer 400 is located on tone side of the light adjusting layer 300 remote from the substrate 100, the protective layer 500 is located on one side of the optical glue layer 400 remote from the light adjusting layer 300. Thus, by using the optical glue layer 400 and a protective layer 500, the light adjusting layer 300 is better protected.

Furthermore, the material forming the protective layer 500 in the present disclosure is not limited, for example, the material forming the protective layer 500 can be poly (ethylene terephthalate), PET.

According to another aspect of the present disclosure, the embodiments of the present disclosure also provide a display device including the display panel described above. Thus, the display device has all the features and advantages of the display panel described above, in particular the higher blackness value, the better visual experiences, and in addition a reduced power consumption.

Figure 4:
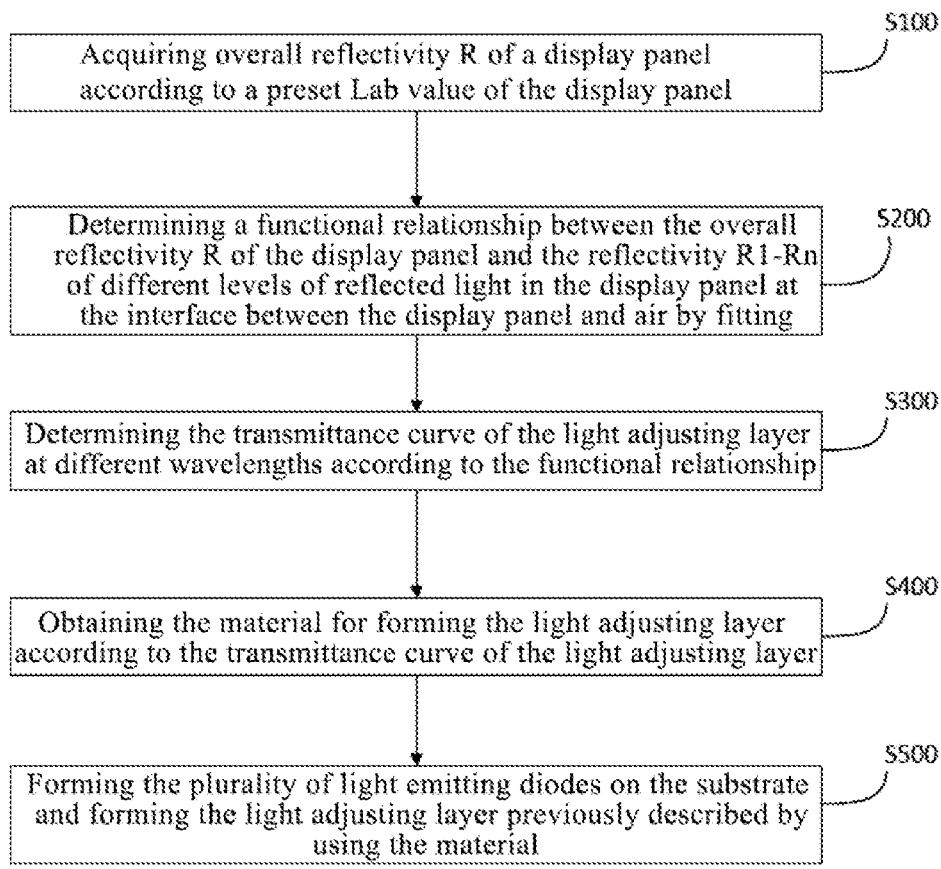
FIG. 4 is a flow diagram of a method of manufacturing a display panel in one embodiment of the present disclosure.

In another aspect of the present disclosure, the present disclosure also provides a method of manufacturing the display panel described above, referring to FIG. 4, the method includes:

S100, obtaining the overall reflectivity R of the display panel according to the preset Lab value of the display panel.

In this step, the overall reflectivity R of the display panel is obtained according to the preset Lab value of the display panel. The overall reflectivity R of the display panel can be obtained by theoretical calculation using the Lab value. The present disclosure is not limited to a specific theoretical calculation method, and a skilled person can use a calculation method conventional in the art.

Furthermore, the preset Lab value of the display panel is $L \in (20 \sim 40)$, a=0, b=0. At this time, the display panel has the higher blackness value and the better visual effect.

It should be noted that the color model (Lab) is based on the human perception of color. The values of Lab describe all colors that can be seen by a person with normal eyesight. Lab is considered as a device independent color model. The Lab color model is composed of luminance (L) and a, b elements related to color. L refers Luminosity, a refers the range from magenta to green, and b refers the range from yellow to blue. The value of L in the present disclosure ranges from 20 to 40, and illustratively, L can be 20, 25, 38, or 40, etc. The values of a and b reflect the color information, and when a and b are zero, the reflected signal of the overall surface of the surface carries no color information. By using the present disclosure, the requirements of the overall target reflectivity by attaching a light adjusting layer on the copper-containing printed circuit board can be met, and at this time, the display panel does not display color information of the substrate, and the display panel has a sufficiently black visual effect.

S200, determining a functional relationship between the overall reflectivity R of the display panel and the reflectivity R1-Rn of different levels of reflected light in the display panel at the interface between the display panel and air by fitting.

In this step, the determining a functional relationship between the overall reflectivity R of the display panel and the reflectivity R1-Rn of different levels of reflected light in the display panel at the interface between the display panel and air by fitting further includes:

providing the light adjusting layers having different transmittances and setting the transmittance of the light adjusting layer between 1% and 99%;

arranging the light adjusting layers with different transmittances on the substrate to obtain a plurality of display panel models, wherein the overall transmittances R' of the display panel models having the light adjusting layers with different transmittances satisfy:

$$R' = R1 + R2 + R3 + R4 + R5 + R6 + \ldots + Rn,$$

Figure 5:
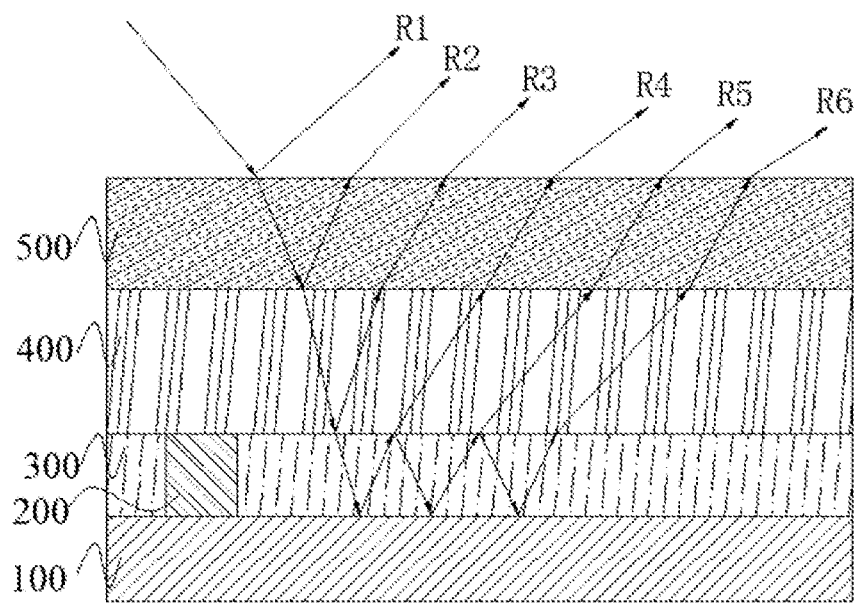
FIG. 5 is an optical path diagram of light entering a display panel in one embodiment of the present disclosure.

With reference to FIG. 5, R1 is the reflectivity of light at the interface between the display panel and the air; R2 is the reflectivity of the reflected light at the interface between the display panel and the air after passing through the interface between the protective layer and the optical glue layer; R3 is the reflectivity of the reflected light at the interface between the display panel and the air after passing through the interface between the optical glue layer and the light conditioning layer; R4 is the reflectivity of the reflected light at the interface between the display panel and the air after passing through the interface between the light conditioning layer and the substrate; R5 is the reflectivity of the reflected light at the interface between the display panel and the air after passing through two reflections at the interface between the light conditioning layer and the substrate; R6 is the reflectivity at the interface between the display panel and the air after the reflected light reflected three times at the interface between the light adjusting layer and the substrate is emitted; by analogy, Rn (not shown in the figure) is the reflectivity at the display panel and air interface after n−3 reflected light exits at the interface between the light adjusting layer and the substrate, wherein the range of values of n decreases as the transmittance of the light adjusting layer decreases. That is, the lower the transmittance of the light adjusting layer is, the more reflected light having a higher number of reflections eventually cannot be emitted from one side of the display panel. In other words, theoretically, the reflectivity of the product is mainly derived from the Fresnel reflection of light on the surface of the product, and a part of the reflected light is reflected back from the transmitted light. Refraction and reflection occur when light reaches each dielectric layer of the display panel. Specifically, when the transmittance of the light adjusting layer is sufficiently low, for example, when the transmittance of the light adjusting layer is less than 2%, the light transmitted into the light adjusting layer is very small, and thus the reflectivity R4 of the reflected light passing through the interface between the light adjusting layer and the substrate at the display panel and the air interface is negligible, and the reflectivity R5, R6 Rn of the reflected light having multiple reflections in the light adjusting layer at the interface between the display panel and the air is negligible, and only R1, R2, and R3 are considered at this time. When the transmittance of the light adjusting layer is low, its main reflectivity comes from the superposition of R1, R2, and R3, the value of R4 is small, and the values of R5, R6 . . . Rn are smaller, which can be ignored, and only R1, R2, R3, and R4 can be considered at this time. Similarly, when the transmittance of the light adjusting layer is high, R5, R6 . . . Rn can be considered according to specific conditions.

The overall reflectivity R' of the plurality of display panel models is measured separately to obtain the overall reflectivity R of the display panel and a functional relationship between the reflectivity R1-Rn of different levels of reflected light in the display panel at the interface between display panel and air. That is, the overall reflectivity R' of the plurality of display panel models is the overall reflectivity R of the display panel when n takes different values: taking the structure shown in FIG. 5 as an example, the optical glue layer 400 and a protective layer 500 are further provided on the light adjusting layer 200; when the transmittance of the light adjusting layer 200 is sufficiently low, for example 1%, then at this moment, all the reflected light of the reflection level in the light adjusting layer cannot be emitted, and at this moment, the measured overall reflectivity R' of the display panel model is equivalent to R1+R2+R3. When the transmittance of the light adjusting layer 200 is low, the reflected light of R5 level and higher level cannot be emitted at this time, and at this time, the measured overall reflectivity R' of the display panel model is equivalent to R1+R2+R3+R4. Thus, a plurality of sets of data R1+R2+R3+R4+R5+R6+ . . . +Rn may be obtained by measuring the overall reflectivity R' of a panel model having a known transmittance of a plurality of light adjusting layers. By fitting the data, a function f(x) of R with respect to Rn can be obtained. The function of R with respect to Rn is then related to the transmittance Tr of the light adjusting layer. Thus, the transmittance Tr of the light adjusting layer can be determined from the function f(x), the R can be obtained from the Lab value previously described.

That is, R1-Rn, wherein the reflectivity Rr of the reflected light passing through the interface between the light adjusting layer and the substrate at the interface between the display panel and the air is related to the reflectivity of the substrate and the transmittance of the light adjusting layer. According to a specific embodiment of the present disclosure, when the display panel has a structure as shown in FIG. 5, Rr=Rbase*Tr*Tr, wherein r=4, Tr is the transmittance of the light adjusting layer, and Rbase is the reflectivity of the substrate.

S300, determining the transmittance curve of the light adjusting layer at different wavelengths according to the functional relationship.

Figure 6:
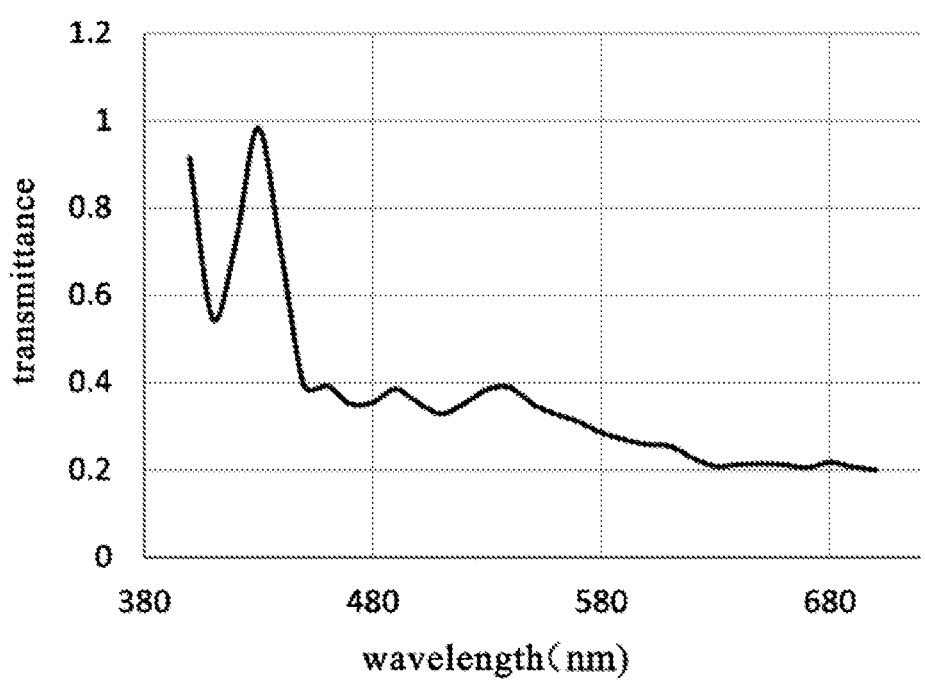
FIG. 6 is a relationship graph of transmittance versus wavelength for a light adjusting layer of one embodiment of the present disclosure.
Figure 7:
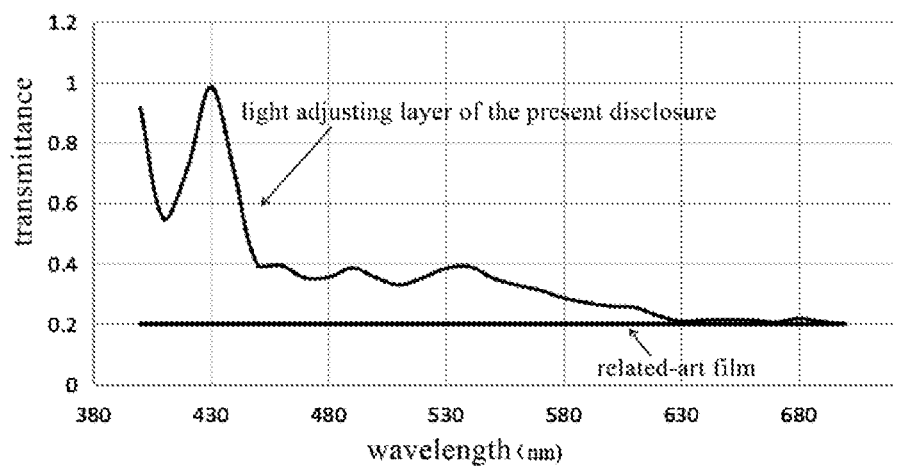
FIG. 7 is a comparison graph between transmittance curves of a prior art film and a light adjusting layer of the present disclosure at different wavelengths.
Figure 8:
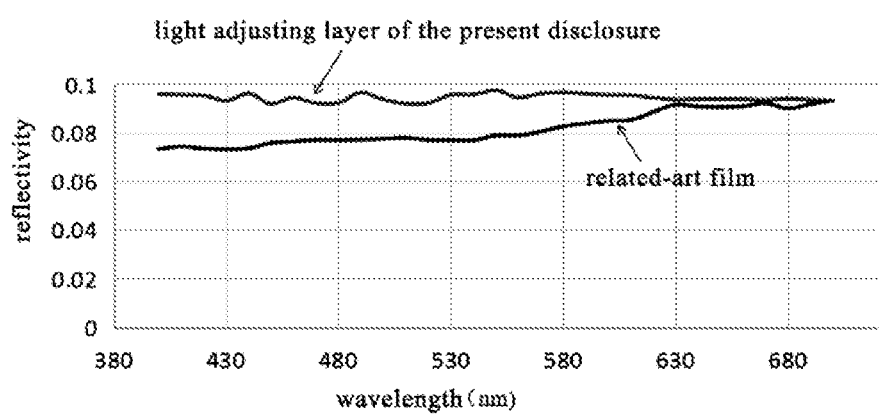
FIG. 8 is a comparison graph between reflectivity curves of a prior art film and a light adjusting layer of the present disclosure at different wavelengths.

In this step, the transmittance curves of the light adjusting layer at different wavelengths are determined according to the functional relationship. As previously mentioned, the transmittance Tr of the light adjusting layer can be determined from the function f(x) and R which is previously obtained by using the Lab value. Taking the display panel having the structure shown in FIG. 5 as an example, then Rr=Rbase*Tr*Tr, wherein r=4. However, when the copper-containing printed circuit board is used as the substrate, the value of Rbase varies with wavelength (refer to FIG. 2). At this time, Tr at different wavelengths can be obtained according to Rr=Rbase*Tr*Tr, wherein r=4. Specifically, referring to FIG. 6, the transmittance of the light adjusting layer under the blue light and the transmittance of the light adjusting layer under the green light are both greater than the transmittance of the light adjusting layer under the red light. Referring to FIG. 7, at a wavelength between 400 and 700 nm, the transmittance of the existing film is the same at the different wavelengths, the transmittance of the light adjusting layer of the present disclosure can vary with wavelength, and the transmittance of the light adjusting layer of the present disclosure is greater than the transmittance of the existing film at the different wavelengths. Referring to FIG. 8, the reflectivity of the light adjusting layer of the present disclosure is comparable to the reflectivity of the existing film. Thus, when the display panel using the existing film and the light adjusting layer of the present disclosure reaches the same picture brightness, since the transmittance of the light adjusting layer of the present disclosure is greater than that of the existing film, in particular, both the transmittance of the light adjusting layer of the present disclosure under the blue light and the transmittance under the green light are significantly greater than that of the existing film, and the power consumption of the display panel using the light adjusting layer of the present disclosure is greatly reduced.

S400, obtaining the material for forming the light adjusting layer according to the transmittance curve of the light adjusting layer.

In this step, the material for forming the light adjusting layer is obtained according to the transmittance curve of the light adjusting layer. This material can be used as the material for forming the light adjusting layer as long as the transmittance of the material in relation to the wavelength follows the trend of the transmittance curve of the light adjusting layer described above.

S500, forming the plurality of light emitting diodes on the substrate and forming the light adjusting layer previously described by using the material.

In this step, the light emitting diodes and the material used for forming the light adjusting layer are arranged on the substrate. Specifically, the light emitting diodes are arranged on the substrate, and the material used for forming the light adjusting layer is coated on the substrate to form the light adjusting layer.

The transmittance of the existing film at the blue light of which the center wavelength is 460 nm, the green light of which the center wavelength is 526 nm, and the red light of which the center wavelength is 629 nm, and the transmittance of the light adjusting layer of the present disclosure are shown in Table 1 below.

TABLE 1

| Wavelength (nm) | 460 | 525 | 629 |
|---|---|---|---|
| Transmittance of existing film | 20% | 20% | 20% |
| Transmittance of the light adjusting layer of the present disclosure | 39% | 38% | 21% |

It can be seen from the table 1 that the transmittance of the light adjusting layer of the present disclosure under green light and blue light is doubled compared with the existing film, and at this time, the same picture brightness is displayed, and the blue light pixels and the green light pixels can save about twice the power consumption.

It should be noted that the present disclosure is described by taking the copper-containing printed circuit board as the substrate of the display panel as an example, wherein there is a specific relationship between the reflectivity of the copper-containing printed circuit board and the wavelength; according to the functional relationship, the transmittance curve of the light adjusting layer at different wavelengths is determined; and the material which can satisfy the transmittance curve and can be used as the material for forming the light adjusting layer, so as to form the light adjusting layer, thereby forming the display panel. The formed display panel can have an advantage of reducing the power consumption.

Similarly, skilled in the art can also explore the relationship between the light adjusting layer and wavelength with reference to the methods of the present disclosure when using other substrate materials, e.g. using glass as the substrate, etc.

In the description of the present disclosure, the terms "outer", "inner", "upper", "lower", "front", "back" and the like are based on the orientation or positional relationship shown in the drawings, and is merely for convenience of describing the disclosure and simplifying the description, but not be construed as limiting the present disclosure.

The embodiments of the present disclosure have been described in detail above, however, the present disclosure is not limited to the specific details of the above embodiments, and various simple modifications can be made to the technical solutions of the present disclosure within the scope of the technical concept of the present disclosure, all falling within the scope of the present disclosure. Furthermore, it should be illustrated that the particular technical features described in the previously described embodiments can be combined in any suitable manner without prejudice.

In the description of the present specification, the reference terms "one embodiment", "some embodiments", "examples", "specific examples", "some examples", and like mean that a particular feature, structure, material or characteristic described in connection with the embodiment or example is included in at least one embodiment or example of the present disclosure. In the present specification, schematic representations of the above terms are not necessarily directed to the same embodiment or example. Moreover, the specific described features, structures, materials or characteristics may be combined in a proper manner in any one or more embodiments or examples. Furthermore, those skilled in the art can integrate and combine different embodiments or examples as well as features of different embodiments or examples described in the present specification without contradicting each other.

While the embodiments of the present disclosure are illustrated and described above, it should be understood that the above embodiments are illustrative and not restrictive to the present disclosure, and those skilled in the art can make changes, modifications, substitutions, and variations to the embodiments within the scope of the present disclosure.

What is claimed is:

1. A display panel, comprising:
    a substrate with varied reflectivity dependent upon different wavelengths;
    a plurality of light emitting diodes, wherein the plurality of light emitting diodes are located on the substrate; and
    a light adjusting layer, wherein the light adjusting layer is located on the substrate, the light adjusting layer and the plurality of light emitting diodes are located on the same side of the substrate, the light adjusting layers has different transmittance at different wavelengths, and the change in transmittances of the light adjusting layers at different wavelengths is inversely correlated with the change in reflectivity of the substrate at corresponding wavelengths.

2. The display panel according to claim 1, wherein the transmittance of a material forming the light adjusting layer decreases at different wavelengths while a reflectivity of the substrate increases at the corresponding wavelengths; or, the transmittances of the materials forming the light adjusting layer increases at different wavelengths while the reflectivity of the substrate decreases at the corresponding wavelengths.

3. The display panel according to claim 2, wherein the material forming the light adjusting layer comprises a black glue material and at least one particle material having a color.

4. The display panel according to claim 1, wherein the substrate is a copper-containing printed circuit board, and the reflectivity of the substrate under blue light and the reflectivity of the substrate under green light are both smaller than the reflectivity of the substrate under red light.

5. The display panel according to claim 1, wherein the display substrate further comprises a protective layer and an optical glue layer, the optical glue layer is located on one side of the light adjusting layer remote from the substrate and the protective layer is located on one side of the optical glue layer remote from the light adjusting layer.

6. A method of manufacturing the display panel according to claim 1, comprising:
obtaining an overall reflectivity R of the display panel according to a preset color model (Lab) value of the display panel;
determining a functional relationship between the overall reflectivity R of the display panel and the reflectivity R1-Rn of different levels of reflected light in the display panel at the interface between the display panel and air by fitting, wherein the reflectivity Rr of the reflected light passing through the interface between the light adjusting layer and the substrate at the interface between the display panel and air is related to the reflectivity of the substrate and the transmittance of the light adjusting layer, and the reflectivity of the substrate at different wavelengths is different;
determining transmittance curve of the light adjusting layer at different wavelengths according to the functional relationship;
determining a material for forming the light adjusting layer according to a transmittance curve of the light adjusting layer; and
forming the plurality of light emitting diodes on the substrate, and forming the light adjusting layer by using the material.

7. The method of claim 6, wherein determining a functional relationship between the overall reflectivity R of the display panel and the reflectivity R1-Rn of different levels of reflected light in the display panel at the interface between the display panel and air by fitting comprises:
providing the light adjusting layers having different transmittances and setting the transmittance of the light adjusting layer between 1% and 99%;
arranging the light adjusting layers with different transmittances on the substrate to obtain a plurality of display panel models, wherein the overall transmittances R' of the display panel models having the light adjusting layers with different transmittances satisfy:

$$R'=R1+R2+R3+R4+R5+R6+\ldots+Rn,$$

wherein the range of values of n decreases as the transmittance of the light adjusting layer decreases; and
measuring the overall reflectivity R' of a plurality of the display panel models, respectively, to obtain a functional relationship between the overall reflectivity R of the display panel and the reflectivity R1-Rn of different levels of reflected light in the display panel at the interface between the display panel and air.

8. The method of claim 6, wherein the preset Lab value of the display panel is L∈(20~40), a=0, b=0.

9. The method of claim 6, wherein the substrate is the copper-containing printed circuit board, the display panel comprises the light adjusting layer, the optical glue layer, and a protective layer, and the reflectivity Rr of the reflected light passing through the interface between the light adjusting layer and the substrate in R1-Rn at the interface between the display panel and air satisfies: Rr=Rbase*Tr*Tr, wherein r=4, Tr is the transmittance of the light adjusting layer, and Rbase is the reflectivity of the substrate.

10. A display device, comprising a display panel, the display panel comprises:
a substrate with varied reflectivity dependent upon different wavelengths;
a plurality of light emitting diodes, wherein the plurality of light emitting diodes are located on the substrate; and
a light adjusting layer, wherein the light adjusting layer is located on the substrate, the light adjusting layer and the plurality of light emitting diodes are located on the same side of the substrate, the light adjusting layers has different transmittance at different wavelengths, and the change in transmittances of the light adjusting layers at different wavelengths is inversely correlated with the change in reflectivity of the substrate at corresponding wavelengths.

11. The display device according to claim 10, wherein the transmittance of a material forming the light adjusting layer decreases at different wavelengths while a reflectivity of the substrate increases at the corresponding wavelengths; or,
the transmittances of the materials forming the light adjusting layer increases at different wavelengths while the reflectivity of the substrate decreases at the corresponding wavelengths.

12. The display device according to claim 11, wherein the material forming the light adjusting layer comprises a black glue material and at least one particle material having a color.

13. The display device according to claim 10, wherein the substrate is a copper-containing printed circuit board, and the reflectivity of the substrate under blue light and the reflectivity of the substrate under green light are both smaller than the reflectivity of the substrate under red light.

14. The display device according to claim 10, wherein the display substrate further comprises a protective layer and an optical glue layer, the optical glue layer is located on one side of the light adjusting layer remote from the substrate and the protective layer is located on one side of the optical glue layer remote from the light adjusting layer.

* * * * *